United States Patent
Toyoda et al.

(10) Patent No.: US 7,314,827 B2
(45) Date of Patent: Jan. 1, 2008

(54) METHOD OF MANUFACTURING SEMICONDUCTOR DEVICE

(75) Inventors: Hiroshi Toyoda, Kamakura (JP); Sachiyo Ito, Yokohama (JP); Masahiko Hasunuma, Yokohama (JP); Hisashi Kaneko, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 270 days.

(21) Appl. No.: 11/181,908

(22) Filed: Jul. 15, 2005

(65) Prior Publication Data
US 2006/0068600 A1   Mar. 30, 2006

(30) Foreign Application Priority Data
Sep. 30, 2004   (JP)   ............... P2004-287089

(51) Int. Cl.
H01L 21/4763   (2006.01)
(52) U.S. Cl. ............... 438/637; 437/687; 257/E21.586
(58) Field of Classification Search ......... 438/637, 438/687; 257/E21.586, E21.588
See application file for complete search history.

(56) References Cited

U.S. PATENT DOCUMENTS 6,429,128 B1 * 8/2002 Besser et al. ............... 438/687
6,881,666 B2 * 4/2005 Kawano ...................... 438/637
2001/0049190 A1   12/2001 Givens
2004/0014312 A1   1/2004 Kunishima et al.

FOREIGN PATENT DOCUMENTS

JP   10-032203   2/1998
JP   2004-040022   2/2004

OTHER PUBLICATIONS

First Office Action issued by the Chinese Patent Office on Mar. 23, 2007, for Chinese Patent Application No. 200510105721, and English-language translation thereof.

* cited by examiner

Primary Examiner—Bradley K Smith
(74) Attorney, Agent, or Firm—Finnegan, Henderson, Farabow, Garrett & Dunner, L.L.P.

(57) ABSTRACT

A method of manufacturing a semiconductor device according to an aspect of the present invention comprises forming a plated film on a substrate which has a recessed portion on its surface so as to bury in the recessed portion by a plating method; forming over the plated film a compressive stress-applying film which is composed of a material having a thermal expansion coefficient of 60% or less compared with a thermal expansion coefficient of a metal composing the plated film; heat-treating while applying a compressive stress to the plated film by the compressive stress-applying film; and removing the compressive stress-applying film and the plated film which is not buried in the recessed portion.

19 Claims, 3 Drawing Sheets

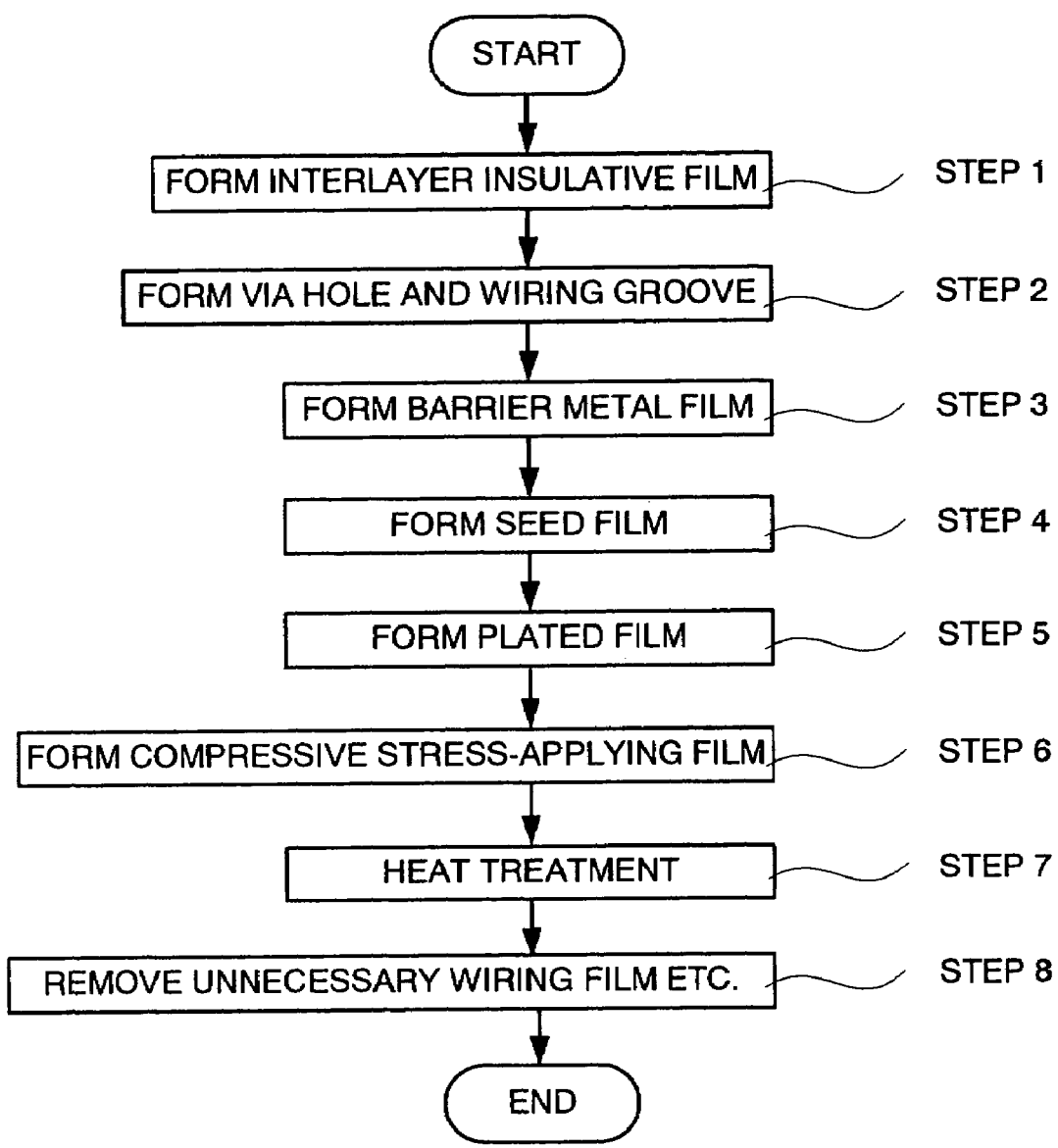

METHOD OF MANUFACTURING SEMICONDUCTOR DEVICE

CROSS-REFERENCE TO RELATED APPLICATIONS

This application is based upon and claims the benefit of priority from the prior Japanese Patent Application No. 2004-287089, filed on Sep. 30, 2004; the entire contents of which are incorporated herein by reference.

BACKGROUND OF THE INVENTION

1. Field of the Invention

The present invention relates to a method of manufacturing a semiconductor device.

2. Description of the Related Art

In recent years, as wiring of the semiconductor device, Cu is being used instead of Al in order to reduce wiring resistance and to improve the resistance to migration such as electromigration (EM) and stress migration (SM) which cause defective wiring.

Because Cu is hardly fabricated by RIE (reactive ion etching) unlike Al, wiring of Cu is formed with a damascene method by which a recessed portion composed of trenches and holes is formed on the surface of an insulation film in advance, Cu is buried in the trenches and holes, and unnecessary Cu is removed by CMP (Chemical Mechanical Polishing) to form wiring.

In the damascene method, a plating method is mainly used to bury Cu. At present, to bury Cu by the plating method, various efforts are being made to bury a microstructure without involving a void (unfilled region). For example, an additive which gives priority in plating to the fine portions is contained in a plating solution so as to grow from the bottoms of the trenches and the holes (so-called bottom-up growth).

But, when a cross-section of Cu is observed, fine vacancies may exist in Cu even if Cu is thoroughly buried, and the Cu grain grows in a heat-treating step after the plating step, and the fine vacancies might aggregate to form voids. This phenomenon can be avoided by lowering the heat-treatment temperature or decreasing the heat-treatment time, but wiring reliability becomes lower because the grains do not grow sufficiently.

There is disclosed a technique that a bias sputtered copper-containing metal film containing different kinds of elements such as Ti, Zr and W is formed on a plated copper film (for example, Japanese Patent Laid-Open Application No. 2004-40022). Here, the content of the different kinds of elements to the bias sputtered copper-containing metal film is very small, and the different kinds of elements are used to spread into the plated copper film.

BRIEF SUMMARY OF THE INVENTION

According to an aspect of the present invention, there is provided a method of manufacturing a semiconductor device comprising forming a plated film on a substrate which has a recessed portion on its surface so as to bury in the recessed portion by a plating method; forming over the plated film a compressive stress-applying film which is composed of a material having a thermal expansion coefficient of 60% or less compared with a thermal expansion coefficient of a metal composing the plated film; heat-treating while applying a compressive stress to the plated film by the compressive stress-applying film; and removing the compressive stress-applying film and the plated film which is not buried in the recessed portion.

BRIEF DESCRIPTION OF THE DRAWINGS

FIG. 1 is a flow chart showing a flow of a manufacturing process of a semiconductor device according to an embodiment of the present invention.

DETAILED DESCRIPTION OF THE INVENTION

Figure 2A:
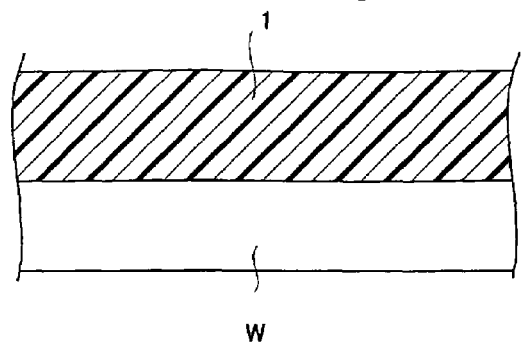
FIG. 2A through FIG. 2H are schematic views of the manufacturing processes of the semiconductor device according to the embodiment of the present invention.

An embodiment of the present invention will be described with reference to the drawings. The same reference numerals are allotted to the same members in the following drawings. FIG. 1 is a flow chart showing a flow of a manufacturing process of a semiconductor device according to this embodiment, and FIG. 2A through FIG. 2H are schematic views of the manufacturing processes of the semiconductor device according to the embodiment.

As shown in FIG. 1 and FIG. 2A, an interlayer insulation film 1 is formed on a semiconductor wafer W (hereinafter simply referred to as "wafer"), on which semiconductor elements and the like (not shown) are formed, by, for example, a chemical vapor deposition (CVD) method or a coating method (step 1). Examples of the constituent materials of the interlayer insulation film 1 are a low-k dielectric film such as an organic Si oxide film, an organic resin film and a porous Si oxide film, an $SiO_2$ film and the like.

Figure 2B:
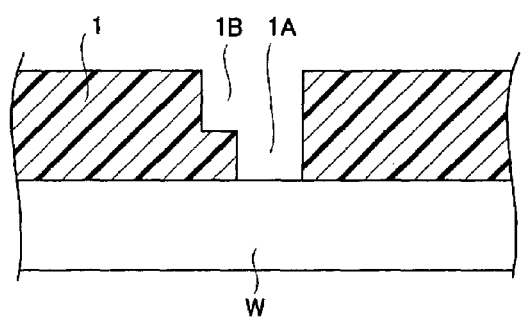

After the interlayer insulation film 1 is formed, a recessed portion which is comprised of a via hole 1A and a wiring trench 1B is formed in the interlayer insulation film 1 by the photolithography technique and Reactive Ion Etching (RIE) as shown in FIG. 2B (step 2).

To form the via hole 1A and the wiring trench 1B, a resist pattern is first formed on the interlayer insulation film 1, and the interlayer insulation film 1 is etched by the RIE with the resist pattern used as the mask to form the via hole 1A in the interlayer insulation film 1. After the via hole 1A is formed in the interlayer insulation film 1, the resist pattern is removed by ashing and the like. Then, the wiring trench 1B is formed by the same procedure. The same procedure can be used to form the via hole 1A after the wiring trench 1B is formed.

Figure 2C:
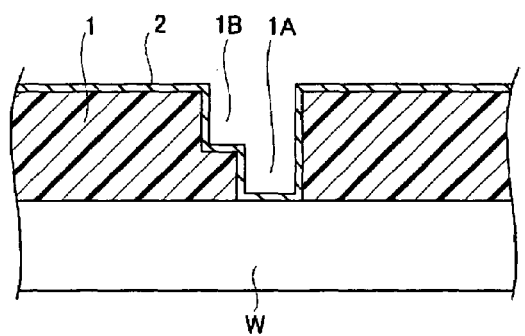

After the via hole 1A and the wiring trench 1B are formed in the interlayer insulation film 1, a barrier metal film 2 which suppresses the metal from diffusing into the interlayer insulation film 1 is formed on the interlayer insulation film 1 by, for example, the sputtering or the CVD as shown in FIG. 2C (step 3). The constituent material of the barrier metal film 2 is, for example, a conductive material such as Ta, Ti, TaN, TiN, NbN, WN or VN. The barrier metal film 2 may also be formed by laminating these materials.

Figure 2D:
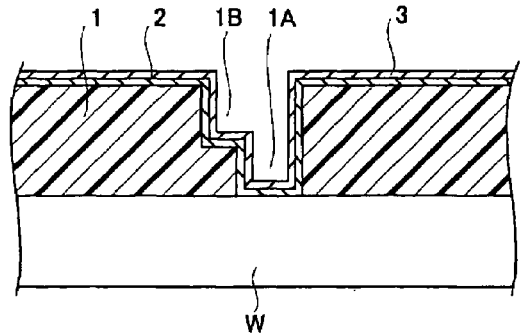

After the barrier metal film 2 is formed on the interlayer insulation film 1, a seed film 3, which allows to flow an electric current at the time of electroplating, is formed on the barrier metal film 2 by, for example, the sputtering as shown in FIG. 2D (step 4). The constituent material of the seed film 3 is a metal such as Cu.

Figure 2E:
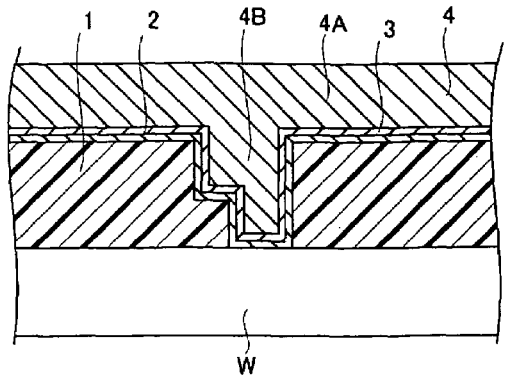

After the seed film 3 is formed on the barrier metal film 2, a plated film 4 is formed on the seed film 3 by, for example, an electroplating method as shown in FIG. 2E (step 5). The constituent material of the plated film 4 is a metal such as Cu. The plated film 4 is formed so as to be entirely buried in the via hole 1A and the wiring trench 1B.

It is desirable that the plated film 4 has a thickness of 200 nm or more at a portion 4A (hereinafter referred to as the "stacked portion") of the plated film 4 which is formed on the interlayer insulation film 1 at the outside of the recessed portion which is comprised of the via hole 1A and the wiring trench 1B. It is because if the plated film 4 has a thickness of less than 200 nm, the stacked portion 4A on a portion 4B (hereinafter referred to as the "wiring configuration portion") of the plated film 4 in the via hole 1A and the wiring trench 1B has a small volume, so that an effect of promoting atom migration from the stacked portion 4A to the wiring configuration portion 4B becomes small even if a compressive stress is applied to the plated film 4.

Figure 2F:
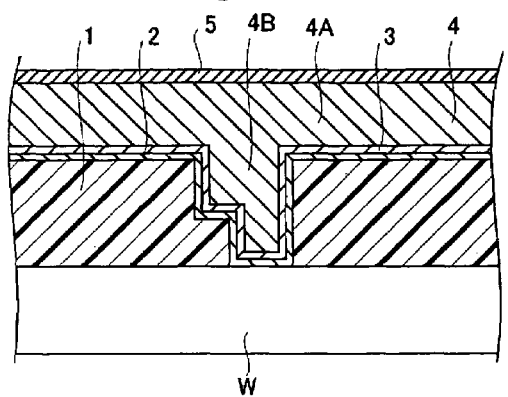

After the plated film 4 is formed, a compressive stress-applying film 5, which applies a compressive stress to the plated film 4, is formed over the plated film 4 as shown in FIG. 2F by a film forming method such as a sputtering method, a plating method or a vapor deposition method which is conducted at a temperature close to room temperature or without heating (step 6). The compressive stress-applying film 5 is comprised of a material having a thermal expansion coefficient of 60% or less compared with a thermal expansion coefficient of the metal configuring the plated film 4 as a whole.

The compressive stress-applying film 5 can be comprised of Ti, Zr, Nb, Mo, Ta, W, a carbide thereof, a nitride thereof, Si carbide, Si nitride, and C (carbon) having the above-described thermal expansion coefficient. Specifically, for example, where the plated film 4 is formed of Cu, the compressive stress-applying film 5 can be comprised of at least any of, for example, Ti, Zr, Nb, Mo, Ta, W, SiC, SiN, and C though variable depending on a metal which configures the plated film 4. Here, if the compressive stress-applying film 5 is comprised of Ta, it has an advantage that it is hardly diffuse into the plated film 4. Where the compressive stress-applying film 5 is comprised of either SiC or SiN, it has advantages that adhesiveness to the plated film 4 is high and it does not peel off easily. The "thermal expansion coefficient" in this embodiment means a thermal expansion coefficient from room temperature to 400° C. The thickness of the compressive stress-applying film 5 is adequate if it does not disturb the application of a compressive stress to the plated film 4, and it is desirably about 20 nm or more and 100 nm or less because there is a possibility that the film is peeled during the heat-treatment to be described later if the thickness is excessively large.

Figure 2G:
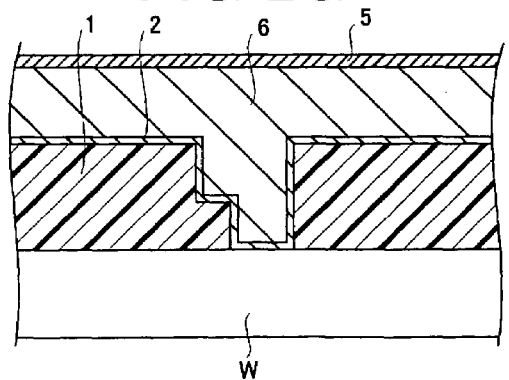

After the compressive stress-applying film 5 is formed, the plated film 4 and the compressive stress-applying film 5 are heat-treated (annealed) to grow the crystals of the seed film 3 and the plated film 4, thereby forming a wiring film 6 as shown in FIG. 2G (step 7).

Figure 2H:
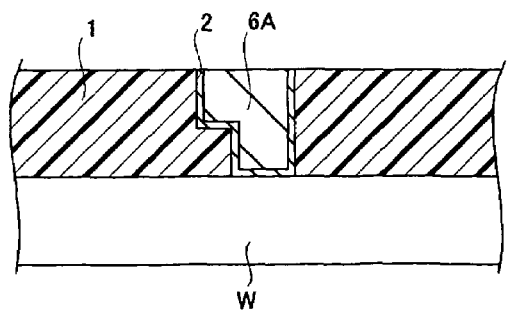

After the wafer W is heat-treated, unnecessary barrier metal film 2 and wiring film 6 which are on the compressive stress-applying film 5 and the interlayer insulation film 1 are removed by polishing, for example, Chemical Mechanical Polishing (CMP) so as to leave the barrier metal film 2 and the wiring film 6 which are present in the via hole 1A and the wiring trench 1B (step 8). Specifically, the wafer W and a polishing pad (not shown) are rotated with the wafer W kept in contact with the polishing pad, and slurry (not shown) is supplied onto the wafer W to polish the wiring film 6 and the like. Polishing is not limited to the CMP but may be conducted by a different method. For example, electropolishing may be used as another method. Thus, wiring 6A is formed in the via hole 1A and the wiring trench 1B as shown in FIG. 2H.

In this embodiment, the plated film 4 and the compressive stress-applying film 5 are heat-treated with the compressive stress-applying film 5, which is comprised of a material having a thermal expansion coefficient of 60% or less compared with a thermal expansion coefficient of the metal configuring the plated film 4, formed over the plated film 4. Thus, voids in the wiring 6A can be decreased, and the reliability of the wiring 6A can be secured as a result. Specifically, when the plated film 4 and the compressive stress-applying film 5 are heat-treated with the compressive stress-applying film 5 formed over the plated film 4, a compressive stress is applied to the stacked portion 4A due to a difference in the thermal expansion coefficient between the metal composing the plated film 4 and the material composing the compressive stress-applying film 5, so that atoms composing the stacked portion 4A are apt to diffuse into the wiring configuration portion 4B. Thus, the vacancies present in the wiring configuration portion 4B are expelled and discharged toward the stacked portion 4A. Therefore, the voids in the wiring 6A can be decreased, and the reliability of the wiring 6A can be secured as a result.

Here, this effect can be obtained remarkably when the compressive stress-applying film 5 is comprised of a material having a thermal expansion coefficient of 60% or less compared with a thermal expansion coefficient of the metal composing the plated film 4. Besides, where the heat-treatment is conducted at a high temperature, this effect can be obtained particularly remarkably. Therefore, the heat-treatment in this embodiment can be conducted at a temperature of 150° C. or more enough for growing the crystal of the metal composing the plated film 4, especially, at a temperature of 200° C. or more, and preferably 400° C. or less. At this time, it is only necessary to set a heat-treatment time to, for example, about 30 seconds or more and 60 minutes or less. Thus, the reliability of the wiring 6A can be secured. As described in Japanese Patent Laid-Open Publication No. 2004-40022, where a bias sputtered copper-containing metal film containing different kinds of elements is formed on the plated film 4, it is presumed that an effective compressive stress cannot be applied to the plated film 4 because the content of different kinds of elements is quite low compared with the bias sputtered copper-containing metal film.

In this embodiment, the plated film 4 is formed so as to bury entirely the via hole 1A and the wiring trench 1B. Therefore, it is hard to reach into the wiring configuration portion 4B even if the material composing the compressive stress-applying film 5 is diffuse into the plated film 4 at the time of the heat-treatment. Thus, the wiring resistance can be prevented from increasing.

In this embodiment, the compressive stress-applying film 5 is formed at a temperature close to room temperature or without heating, so that a larger compressive stress can be applied to the plated film 4. In other words, the larger a thermal expansion difference between the plated film 4 and the compressive stress-applying film 5 at the heat-treatment temperature, the larger the compressive stress applied to the plated film 4 becomes. Meanwhile, when the temperature is increased, the compressive stress-applying film 5 expands with a thermal expansion coefficient of the material composing the compressive stress-applying film 5, so that the lower the film forming temperature of the compressive stress-applying film 5, the larger a thermal expansion difference from the plated film 4 at the heat-treatment temperature becomes. Therefore, the lower the forming temperature of the compressive stress-applying film 5, the larger the compressive stress applied to the plated film 4 at the time of heat-treatment becomes. In this embodiment, the compressive stress-applying film 5 is formed at a temperature close to room temperature or without heating, so that a larger compressive stress can be applied to the plated film 4 than when the compressive stress-applying film 5 is formed at a high temperature.

EXAMPLE 1

Example 1 will be described below. In this example, three wafers, which were formed by the method of the above-described embodiment and had wiring heat-treated at different heat-treatment temperatures, were prepared for each heat-treatment temperature. They were measured for a defect density in the wiring by a defect inspection apparatus, and a reliability test was conducted on the wiring. In this example, the plated film was composed of Cu, and the compressive stress-applying film was composed of Ta. The compressive stress-applying film was formed to have a thickness of 50 nm by a sputtering method without heating. Cu has a thermal expansion coefficient of $16.7 \times 10^{-6}/°$ C. at room temperature, and Ta has a thermal expansion coefficient of $7.1 \times 10^{-6}/°$ C. at room temperature, so that the thermal expansion coefficient of Ta is 42.5% compared with that of Cu. The heat-treatment was conducted at 150° C., 200° C., 250° C. and 300° C. each for one hour. As a comparative example for comparison with the example, wiring which was formed without the compressive stress-applying film was measured for a defect density in the same manner as in the example, and the reliability test was also conducted.

The results will be described below. Table 1 shows heat-treatment temperatures and defect densities in wiring according to Example and Comparative Example. Each numeric value of the defect density in Table 1 is an average value of the defect densities of the three wafers.

TABLE 1

|  | 150° C. | 200° C. | 250° C. | 300° C. |
|---|---|---|---|---|
| Example: Defect density (arb.) | 3.2 | 3.9 | 3.7 | 4.2 |
| Comparative Example: Defect density (arb.) | 5.3 | 8.3 | 13.4 | 29.6 |

As shown in Table 1, the defect density became larger as the heat-treatment temperature became higher in the comparative example, but the defect density did not change substantially even if the heat-treatment temperature was increased in the example. Meanwhile, the reliability test was conducted until the wiring became fail, and both the example and the comparative example took a longer time until the wiring became fail as the heat-treatment temperature became higher. It was confirmed from the results that when the compressive stress-applying film composed of Ta was formed on the plated film, the reduction of the number of defects and the securing of reliability could be realized.

EXAMPLE 2

Example 2 will be described below. The defect density in wiring was measured, and the reliability test of wiring was conducted in this example by the same procedure as in Example 1. In this example, a plated film was composed of Cu, a compressive stress-applying film was composed of SiC and was formed by the sputtering method without heating. SiC had a thermal expansion coefficient of $4.9 \times 10^{-6}/°$ C. at room temperature, and the thermal expansion coefficient of SiC was 29.3% compared with the thermal expansion coefficient of Cu.

The results will be described below. In this example, even if the heat-treatment temperature was increased in the same manner as in Example 1, the defect density did not change substantially. It took a longer time until the wiring became fail as the heat-treatment temperature became higher in the same manner as in Example 1. It was confirmed from the results that when a compressive stress-applying film composed of SiC was formed on the plated film, the reduction of the number of defects and the securing of reliability could be realized.

EXAMPLE 3

Example 3 will be described below. In this example, the defect density in wiring was measured, and the reliability test of wiring was conducted by the same procedure as in Example 1. In this example, the plated film was composed of Cu, and the compressive stress-applying film was composed of Ti. Ti had a thermal expansion coefficient of $8.6 \times 10^{-6}/°$ C. at room temperature, and Ti had a thermal expansion coefficient of 51.5% compared with the thermal expansion coefficient of Cu.

The results will be described below. In this example, the defect density did not change substantially even if the heat-treatment temperature was increased in the same manner as in Example 1. It took a longer time until the wiring became fail as the heat-treatment temperature became higher in the same manner as in Example 1. It was confirmed from the results that when a compressive stress-applying film composed of Ti was formed on the plated film, the reduction of the number of defects and the securing of reliability could be realized.

The present invention is not limited to the descriptions in the above embodiment, and the configuration, materials and arrangement of individual members can be modified as required without deviating from the spirit and the scope of the present invention.

What is claimed is:

1. A method of manufacturing a semiconductor device, comprising:
    forming a plated film on a substrate which has a recessed portion on its surface so as to bury in the recessed portion by a plating method, wherein the plated film has a thickness 200 nm or more on the substrate and outside of the recessed portion;
    forming over the plated film a compressive stress-applying film which is composed of a material having a thermal expansion coefficient of 60% or less compared with a thermal expansion coefficient of a metal composing the plated film;
    heat-treating the plated film and the compressive stress-applying film; and
    removing the compressive stress-applying film and the plated film which is not buried in the recessed portion.

2. A method of manufacturing a semiconductor device according to claim 1, wherein the plated film is formed so as to be buried in the entire recessed portion.

3. A method of manufacturing a semiconductor device according to claim 1, wherein the compressive stress-applying film has a thickness of 20 nm or more and 100 nm or less.

4. A method of manufacturing a semiconductor device according to claim 1, wherein the compressive stress-applying film contains at least any of Ti, Zr, Nb, Mo, Ta, W, their carbide, their nitride, Si carbide, Si nitride and C.

5. A method of manufacturing a semiconductor device according to claim 1, wherein the recessed portion is comprised of at least either a via hole or a wiring trench.

6. A method of manufacturing a semiconductor device according to claim 1, wherein the metal composing the plated film is Cu.

7. A method of manufacturing a semiconductor device according to claim 6, wherein the compressive stress-applying film is composed of at least any of Ti, Zr, Nb, Mo, Ta, W, SiC, SiN, and C.

8. A method of manufacturing a semiconductor device according to claim 7, wherein the compressive stress-applying film is composed of Ta.

9. A method of manufacturing a semiconductor device according to claim 7, wherein the compressive stress-applying film is composed of at least any of SiC and SiN.

10. A method of manufacturing a semiconductor device according to claim 1, wherein the compressive stress-applying film is formed by a film forming method which is conducted without heating.

11. A method of manufacturing a semiconductor device according to claim 1, wherein the compressive stress-applying film is formed by any of a sputtering method, a plating method and a vapor deposition method.

12. A method of manufacturing a semiconductor device according to claim 1, wherein the heat-treatment is conducted at a temperature of 150° C. or more.

13. A method of manufacturing a semiconductor device according to claim 12, wherein the heat-treatment is conducted at a temperature of 400° C. or less.

14. A method of manufacturing a semiconductor device according to claim 12, wherein the heat-treatment is conducted for 30 seconds or more and 60 minutes or less.

15. A method of manufacturing a semiconductor device according to claim 1, wherein the substrate comprises a seed film on its surface, and the plated film is formed while an electric current is flown to the seed film.

16. A method of manufacturing a semiconductor device according to claim 15, wherein the substrate further comprises a barrier metal film, and the seed film is formed on the barrier metal film.

17. A method of manufacturing a semiconductor device according to claim 1, wherein the substrate comprises an interlayer insulation film, and the recessed portion is formed in the interlayer insulation film.

18. A method of manufacturing a semiconductor device according to claim 1, wherein the compressive stress-applying film and the plated film which is not buried in the recessed portion are removed by chemical mechanical polishing.

19. A method of manufacturing a semiconductor device according to claim 1, wherein the substrate comprises a semiconductor wafer on which semiconductor element is formed.

* * * * *